(12) United States Patent
Ponoth et al.

(10) Patent No.: US 9,337,188 B2
(45) Date of Patent: May 10, 2016

(54) METAL-INSULATOR-METAL CAPACITOR STRUCTURE

(71) Applicant: Broadcom Corporation, Irvine, CA (US)

(72) Inventors: Shom Surendran Ponoth, Newport Beach, CA (US); Changyok Park, Irvine, CA (US); Guang-Jye Shiau, Irvine, CA (US); Akira Ito, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 24 days.

(21) Appl. No.: 14/072,723

(22) Filed: Nov. 5, 2013

(65) Prior Publication Data

US 2015/0108557 A1   Apr. 23, 2015

Related U.S. Application Data

(60) Provisional application No. 61/894,376, filed on Oct. 22, 2013.

(51) Int. Cl.
*H01L 49/02* (2006.01)
*H01L 27/08* (2006.01)
*H01L 27/108* (2006.01)
*H01L 23/522* (2006.01)
*H01L 27/06* (2006.01)

(52) U.S. Cl.
CPC ...... *H01L 27/0805* (2013.01); *H01L 27/10855* (2013.01); *H01L 28/40* (2013.01); *H01L 28/90* (2013.01); *H01L 23/5223* (2013.01); *H01L 27/0629* (2013.01); *H01L 2924/0002* (2013.01)

(58) Field of Classification Search
CPC ................ H01L 28/40; H01L 27/0805; H01L 27/10855
See application file for complete search history.

(56) References Cited

U.S. PATENT DOCUMENTS

| 5,208,725 | A | 5/1993 | Akcasu | |
|---|---|---|---|---|
| 6,208,500 | B1* | 3/2001 | Alexander et al. | 361/303 |
| 2011/0210384 | A1* | 9/2011 | Xia et al. | 257/296 |
| 2014/0021521 | A1* | 1/2014 | Lim | 257/296 |
| 2014/0284671 | A1* | 9/2014 | Hung | H01L 21/28 257/296 |

* cited by examiner

*Primary Examiner* — Phat X Cao
(74) *Attorney, Agent, or Firm* — McDermott Will & Emery LLP

(57) ABSTRACT

A capacitor structure in a semiconductor device includes a semiconductor substrate having a top surface and a bottom surface opposite the top surface, an isolation region having a top surface and a bottom surface, opposite the top surface, the bottom surface of the isolation region being disposed on the top surface of the semiconductor substrate. The capacitor structure also includes a gate terminal structure disposed on the top surface of the isolation region and a diffusion contact structure disposed on the top surface of the isolation region and arranged parallel to the gate terminal structure. In some aspects, the gate terminal structure is connected to a first contact node and the diffusion contact structure is connected to a second contact node, in which the first and second contact nodes form opposing nodes of the capacitor structure.

21 Claims, 7 Drawing Sheets

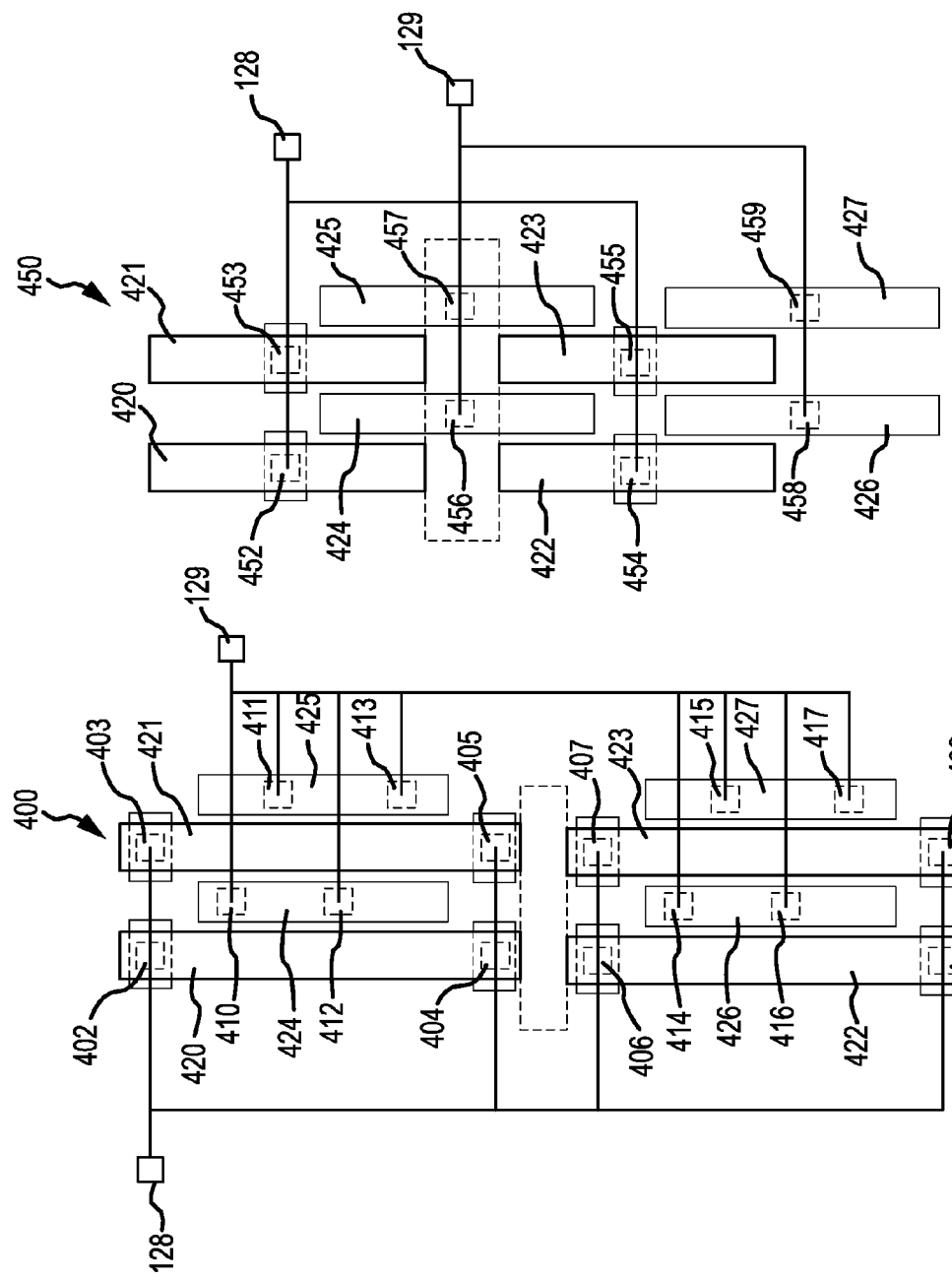

METAL-INSULATOR-METAL CAPACITOR STRUCTURE

CROSS-REFERENCE TO RELATED APPLICATIONS

The present application claims the benefit of U.S. Provisional Patent Application Ser. No. 61/894,376, titled "METAL-INSULATOR-METAL CAPACITOR STRUCTURE," filed on Oct. 22, 2013, which is hereby incorporated by reference in its entirety for all purposes.

TECHNICAL FIELD

The present description relates generally to semiconductor devices, and more particularly, but not exclusively, to metal-insulator-metal capacitors.

BACKGROUND

Metal-insulator-metal (MIM) capacitors and metal-oxide-metal (MOM) capacitors have been used extensively in the fabrication of integrated analog and mixed signal circuits on semiconductor dies. Conventionally, a MIM capacitor includes a dielectric situated between top and bottom metal plates, which form the electrodes of the MIM capacitor. On the other hand, a MOM capacitor includes an oxide dielectric situated between adjacent metal plates, which form the electrodes of the MOM capacitor. MIM and MOM capacitors are fabricated on semiconductor dies during back-end-of-line (BEOL) processing.

BRIEF DESCRIPTION OF THE DRAWINGS

Certain features of the subject technology are set forth in the appended claims. However, for purpose of explanation, several embodiments of the subject technology are set forth in the following figures.

FIGS. 4A-4B illustrate top-view examples of a capacitor structure layout in accordance with one or more implementations of the subject technology.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block diagram form in order to avoid obscuring the concepts of the subject technology.

Use of the specialized dielectric and metal layers required to form the MIM capacitor dielectric and the bottom and top MIM capacitor electrodes during BEOL processing can require multiple process steps and masks beyond those typically used in complementary metal-oxide-semiconductor (CMOS) process flows, which can undesirably increase manufacturing cost. For MOM capacitors, the low dielectric constant (low-K) of the dielectric materials present between routing metallization layers, result in conventional MOM capacitors having relatively low capacitance densities.

The subject disclosure provides a capacitor structure formed in a semiconductor device based on self-aligned contact technology and replacement metal gate technology. The capacitor structure includes wall spacers that allow distances between opposing metal plates to be minimized. In this regard, the distance between conductive plates can be decreased to a specified distance depending on implementation in order to increase the capacitance density of the capacitor structure. The capacitor structure also includes interconnection between components of the capacitor structure to opposing nodes to facilitate the increased capacitance density.

In some aspects, a capacitor structure in a semiconductor device includes a semiconductor substrate having a top surface and a bottom surface opposite the top surface, and an isolation region having a top surface and a bottom surface, opposite the top surface, with the bottom surface of the isolation region being disposed on the top surface of the semiconductor substrate. The capacitor structure also includes a gate terminal structure disposed on the top surface of the isolation region and a diffusion contact structure disposed on the top surface of the isolation region and arranged parallel to the gate terminal structure. In some aspects, the gate terminal structure is connected to a first contact node and the diffusion contact structure is connected to a second contact node, in which the first and second contact nodes form opposing nodes of the capacitor structure.

Figure 1A:
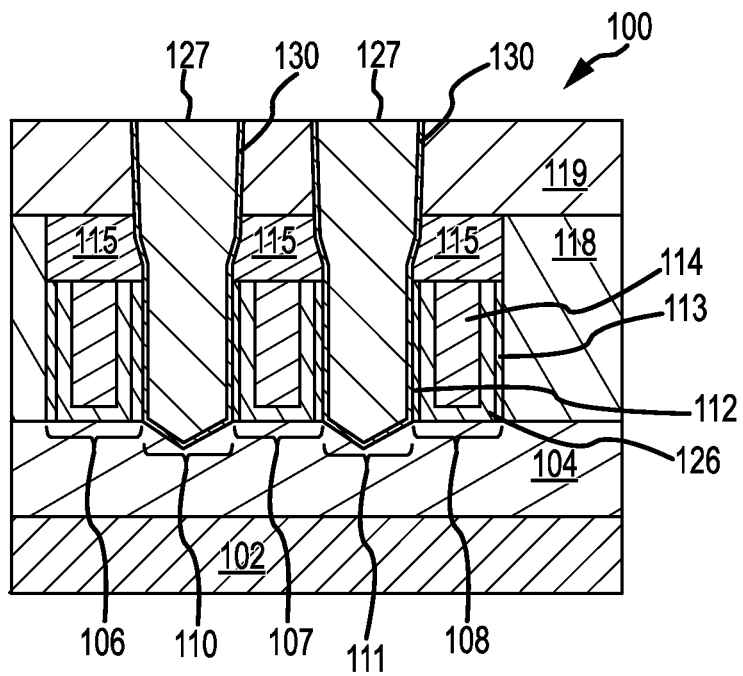
FIGS. 1A-1D illustrates examples of a capacitor structure in accordance with one or more implementations of the subject technology.
Figure 1B:
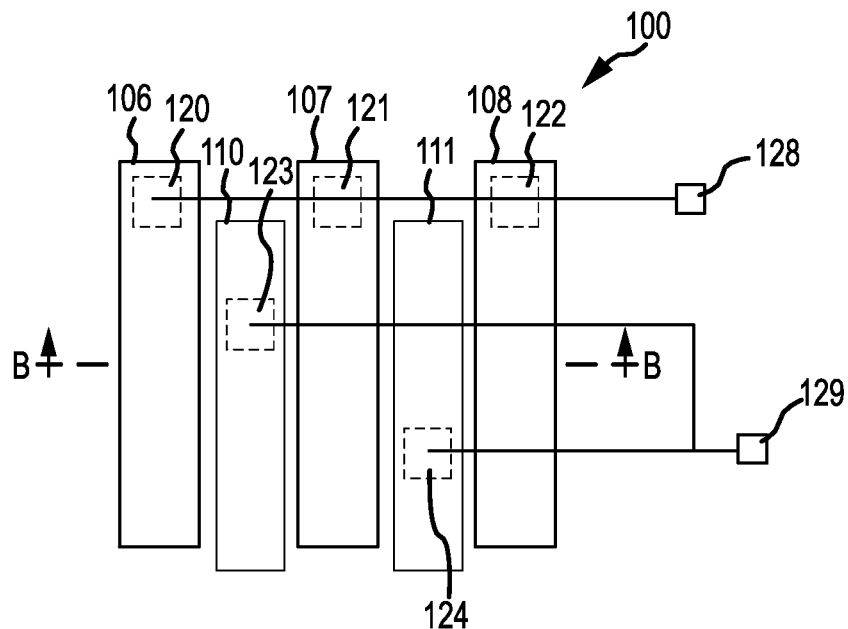
Figure 1C:
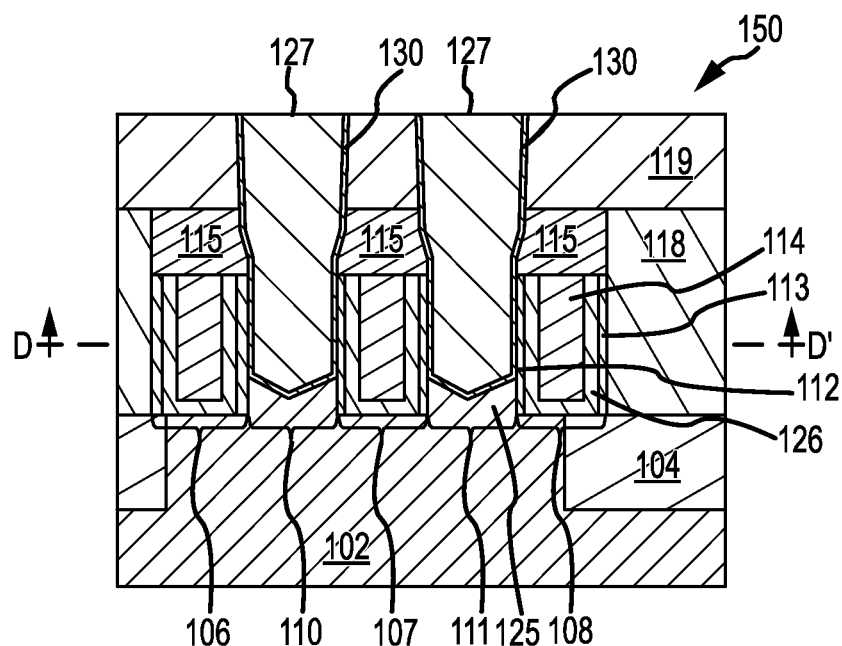
Figure 1D:
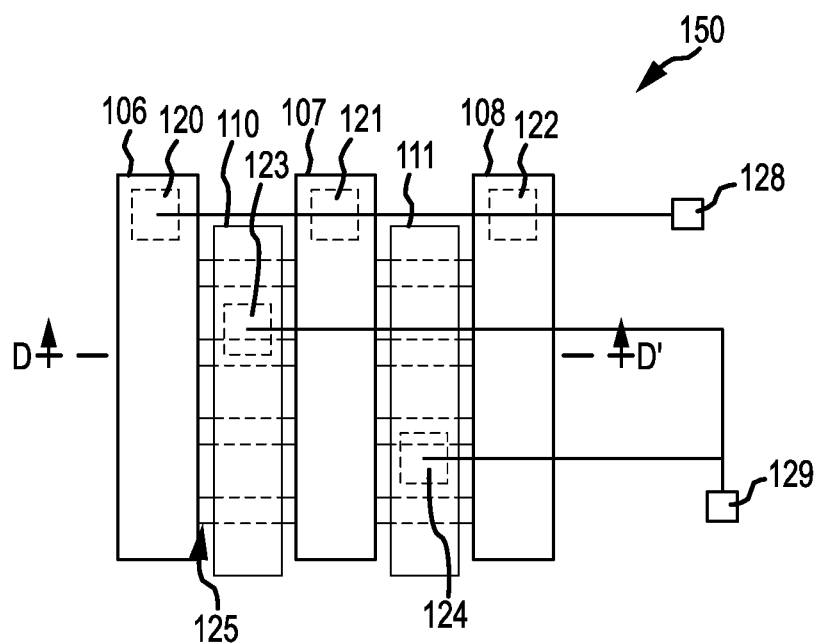

FIGS. 1A-1D illustrates examples of a capacitor structure in accordance with one or more implementations of the subject technology with FIG. 1A illustrating a cross-sectional view of the capacitor structure, FIG. 1B illustrating a top-view of the capacitor structure layout, FIG. 1C illustrating a cross-sectional view of the capacitor structure with fin-shaped structures, FIG. 1D illustrating a top-view of the capacitor structure layout with the fin-shaped structures. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

Referring to FIG. 1A, a capacitor structure 100 in a semiconductor includes a semiconductor substrate 102, an isolation region 104, gate terminal structures 106-108, and diffusion contact structures 110 and 111. The capacitor structure 100 may be configured to provide a thinner dielectric segment and more efficient interconnection to the gate terminal structures and diffusion contact structures than conventional approaches in fabricating MIM capacitive devices during BEOL processing. In some aspects, the capacitor structure 100 includes a single gate terminal structure and a single diffusion contact structure (including the semiconductor substrate 102 and isolation region 104).

The semiconductor substrate 102 includes a top surface and may include a bottom surface opposite of the top surface. The isolation region 104 includes a top surface and a bottom surface opposite of the top surface. In this regard, the bottom surface of the isolation region 104 is disposed over and adjacent to the top surface of the semiconductor substrate 102. The semiconductor substrate 102 can be configured to support the isolation region 104 as well as other semiconductor devices including the gate terminal structures 106-108 and the diffusion contact structures 110 and 111.

The isolation region 104 may be configured to electrically isolate the gate terminal structures 106-108 from the semiconductor substrate 102. In some implementations, the isolation region 104 represents a shallow trench isolation (STI) region comprised of silicon oxide or other dielectric material. The isolation region may include multiple isolation layers with a bottom surface of the first isolation layer 104 disposed adjacent to the top surface of the semiconductor substrate 102, a bottom surface of a second isolation layer 118 disposed adjacent to the top surface of the first isolation layer 104 and adjacent to the gate terminal structures 106-108 and a bottom surface of a third isolation layer 119 disposed adjacent to a top surface of the second isolation layer 118 and adjacent to the diffusion contact structures 110 and 111.

The gate terminal structures 106-108 are disposed above the top surface the semiconductor substrate 102. In certain aspects, the gate terminal structures 106-108 are disposed adjacent to the top surface of the isolation region 104. Each of gate terminal structures includes a first wall spacer 112, a second wall spacer 113 opposite of the first wall spacer 112, a gate filler 114 disposed between the first and second wall spacers 112, 113, and an etch-stop structure 115 disposed above and adjacent to the gate filler 114 and the first and second wall spacers 112, 113. The first and second wall spacers 112 and 113 and the etch-stop structure 115 can be configured to form a capacitor dielectric. The gate filler 114 can be configured to serve as a capacitor terminal.

The first and second wall spacers 112 and 113 may include a high-k gate dielectric or other oxide dielectric material, and can be formed by depositing a layer of the oxide dielectric material such as silicon nitride by employing a chemical vapor deposition (CVD) process or other deposition process and then etching the layer of oxide dielectric material in an etch-back process, for example.

In some aspects, the etch-stop structure 115 is composed of a non-oxide dielectric material (e.g., Silicon Carbide (SiC), Silicon-boron Carbon-nitride (SiBCN), or Silicon Nitride (SiN)) or other non-oxide dielectric material suitable for formation of a self-aligned contact (SAC) and can be formed by depositing a layer of non-oxide dielectric material such as silicon nitride over the gate terminal structures 106-108 by employing a CVD process or other deposition process. By way of example, the gate filler 114 may be disposed into cavities defined by the first and second wall spacers 112, 113 after the gate terminal structure locations have been defined. In this respect, the gate filler 114 may be recessed, and then the etch-stop structure 115 material may be damascened (i.e., deposit material and polish excess material from flat regions) onto the gate filler 114. In some aspects, the material of the etch-stop structure 115 is different from the material of the first and second wall spacers 112, 113.

The gate filler 114 can include a gate metal to represent a first metal plate. The gate metal may include tungsten (W), aluminum (Al), molybdenum (Mo), ruthenium (Ru), tantalum carbide nitride (TaCN), titanium nitride (TiN), tantalum nitride (TaN) or other gate metal material suitable for utilization in a metal plate and combinations thereof. The gate filler 114 can be formed by employing a physical vapor deposition (PVD), a CVD process, or other deposition process, which can then be followed by a chemical-mechanical planarization (CMP) process to clean any residual gate metal material from the surface of the first and second wall spacers 112 and 113 or isolation region 104, and to shape the gate filler 114, the first and second wall spacers 112 and 113, and isolation region 104 based on a desired height for each of the gate terminal structures 106-108.

In certain aspects, the gate filler 114 includes a work function metal layer 126. In this respect, the work function metal layer 126 is disposed adjacent to the top surface of the first isolation layer 104 and the first and second wall spacers 112 and 113, with the gate metal material disposed over and adjacent to the work function metal layer 126 to complete the gate filler 114.

The diffusion contact structures 110 and 111 are disposed above the top surface semiconductor substrate 102 and adjacent to the top surface of the isolation region 104. In some aspects, the diffusion contact structures 110 and 111 are disposed between the gate terminal structures 106-108. In this regard, the gate terminal structures 106-108 are laterally spaced apart from one another by respective diffusion contact structures 110 and 111 along a lateral axis (e.g., axis B-B'). In some aspects, the diffusion contact structures 110 and 111 have a length that extends in a direction perpendicular to the lateral axis (e.g., extended in parallel to the gate terminal structures 106-108).

The diffusion contact structures 110 and 111 include a metal segment 127 such as Tungsten to represent a second metal plate. In this respect, the contact metal is dispensed into etched cavities between the gate terminal structures 106-108, and disposed adjacent to the top surface of the isolation region 104 and the first and second wall spacers of adjacent gate terminal structures. In some aspects, the diffusion contact structures 110 and 111 include a liner layer 130 that is disposed between the metal segment 127 and the semiconductor substrate 102 including the first and second wall spacers 112 and 113 of adjacent gate terminal structures. The liner layer 130 protects the underlying semiconductor substrate 102 (e.g., Silicon substrate) from the metal deposition process during the formation of the diffusion contact structures 110 and 111. The liner layer 130 also acts as a glue layer between the contact metal and the adjacent dielectric.

Each of the diffusion contact structures 110 and 111 has a first sidewall surface and a second sidewall surface opposite of the first sidewall surface. The second sidewall surface of a first diffusion contact structure (e.g., 110) and the first sidewall surface of a second diffusion contact structure (e.g., 111) may be arranged adjacent to the etch-stop structure 115 and the first and second wall spacers 112, 113 of one of the gate terminal structures 106-108 such as an adjacent gate terminal structure (e.g., the gate terminal structure 107).

The first and second wall spacers 112, 113 including the etch-stop structure 115 may represent components of a self-aligned contact technology. The first and second wall spacers 112, 113 can provide controlled isolation between the diffusion contact structures 110 and 111 and the gate terminal structures 106-108 leading to a reduced allowable distance between the structures compared to conventional approaches. Since capacitance is based on a distance between opposing metal plates, the reduction in the distance presented in the capacitor structure of the subject technology translates into an increased amount of capacitance density. The etch-stop structures 115 located above respective gate terminal structures also may allow controlled distances to be achieved between the opposing metal plates (e.g., each of the gate terminal structures representing the first metal plate, each of the diffusion contact structures representing the second metal plate).

In one or more implementations, the gate terminal structures 106-108 are connected to a first contact node 128 and the diffusion contact structures 110 and 111 are connected to a second contact node 129, in which the first and second contact nodes 128 and 129 form opposing nodes of the capacitor structure 100. In this respect, the gate terminal structures 106-108 and the diffusion contact structures 110 and 111 can be configured to act as positive or negative capacitive terminals depending on implementation. By way of example, the first contact node 128 may represent the anode contact and the second contact node 129 may represent the cathode contact of the capacitor structure 100.

Referring to FIG. 1B, the top-view of the layout of the capacitor structure 100 shows the gate terminal structures 106-108 laterally separated by the diffusion contact structures 110 and 111 along the lateral axis (e.g., axis B-B'). The capacitor structure 100 includes first contacts 120-122 formed on opposite ends of the gate terminal structures 106-108 and second contacts 123 and 124 formed on the diffusion contact structures 110 and 111 with the first contacts of adjacent gate terminal structures being aligned with one another and the second contacts of adjacent diffusion contact structures being staggered of one another.

In one or more implementations, the first contacts 120-122 are connected to the first contact node 128 and the second contacts 123 and 124 are connected to the second contact node 129 to complete the capacitor structure 100. The first contacts 120-122, being aligned with one another, can be connected to the first contact node 128 via a common metallization layer. On the other hand, the second contacts 123 and 124, being staggered of one another, can be connected to the second contact node 129 via respective metallization layers. In some aspects, the second contacts 123 and 124 are connected to a common metallization layer.

The first contacts 120-122 and second contacts 123, 124 can include tungsten or other metal to form contacts. The first contacts 120-122 may be formed by employing a mask and etch process to form trenches in the third isolation layer 119 and etch-stop structure 115 of the gate terminal structures 106-108, and then using a contact formation process to form the first contacts 120-122. Similarly, the second contacts 123, 124 may be formed by employing the mask and etch process to form trenches in the diffusion contact structures 110, 111, and then using the contact formation process to form the second contacts 123, 124. The first contacts 120-122 and second contacts 123, 124 can be configured to increase the available metal-dielectric surface area or interface area, and also serve as contact surfaces to facilitate integration with other semiconductor devices (e.g., integrated circuits containing multiple transistors, integrated resistors, integrated inductors, and integrated MIM capacitors and/or integrated MOM capacitors).

As shown in FIG. 1B, the diffusion contact structures 110 and 111 are arranged between the opposite ends of the gate terminal structures 106-108. In this respect, the length of the diffusion contact structures 110 and 111 is less than a length of the gate terminal structures 106-108. In some aspects, the diffusion contact structures 110 and 111 are staggered from the gate terminal structures 106-108. In this respect, the length of the diffusion contact structures 110 and 111 may be greater than the length of the gate terminal structures 106-108

In certain aspects, the first contacts 120-122 are formed on centered locations of the gate terminal structures 106-108 and the second contacts 123 and 124 are formed on centered locations of the diffusion contact structures 110 and 111 with the first contacts of adjacent gate terminal structures being aligned with one another and the second contacts of adjacent diffusion contact structures being aligned with one another.

Referring to FIG. 1C, a capacitor structure 150 in a semiconductor device includes a semiconductor substrate 102, an isolation region 104, gate terminal structures 106-108, and diffusion contact structures 110 and 111. Because the capacitor structure 150 is substantially similar to the capacitor structure 100 of FIG. 1A, only differences will be discussed with respect to FIG. 1C.

The capacitor structure 150 includes fin-shaped structures 125 formed at a surface of the semiconductor substrate 102. The fin-shaped structures 125 may be spaced apart laterally in a direction perpendicular to the lateral axis (e.g., axis D-D') with the diffusion contact structures 110 and 111 disposed over and across the fin-shaped structures 125.

Referring to FIG. 1D, the top-view of the layout of the capacitor structure 150 shows the gate terminal structures 106-108 laterally separated by the diffusion contact structures 110 and 111 along the lateral axis (e.g., axis D-D'). The capacitor structure 150 includes first contacts 120-122 formed on opposite ends of the gate terminal structures 106-108 and second contacts 123 and 124 formed on the diffusion contact structures 110 and 111 with the first contacts of adjacent gate terminal structures being aligned with one another and the second contacts of adjacent diffusion contact structures being staggered of one another.

As shown in FIG. 1D, the diffusion contact structures 110 and 111 are arranged between the opposite ends of the gate terminal structures 106-108. In some aspects, the diffusion contact structures 110 and 111 are staggered from the gate terminal structures 106-108. In one or more implementations, the first contacts 120-122 are connected to the first contact node 128 and the second contacts 123 and 124 are connected to the second contact node 129 to complete the capacitor structure 150.

Figure 2A:
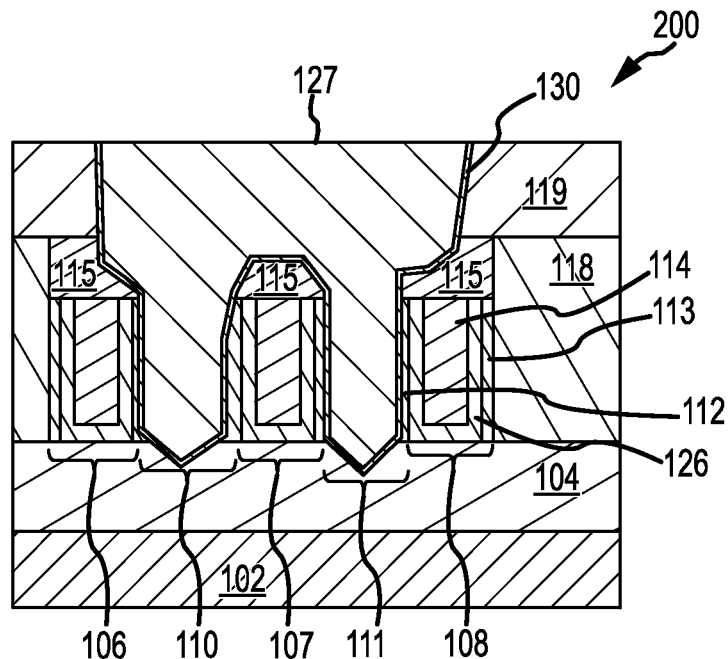
FIGS. 2A-2D illustrates examples of a capacitor structure in accordance with one or more implementations of the subject technology.
Figure 2B:
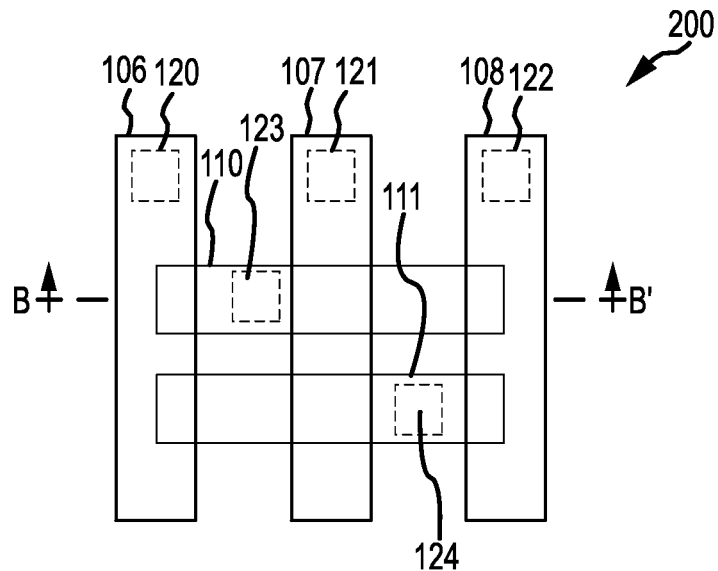
Figure 2C:
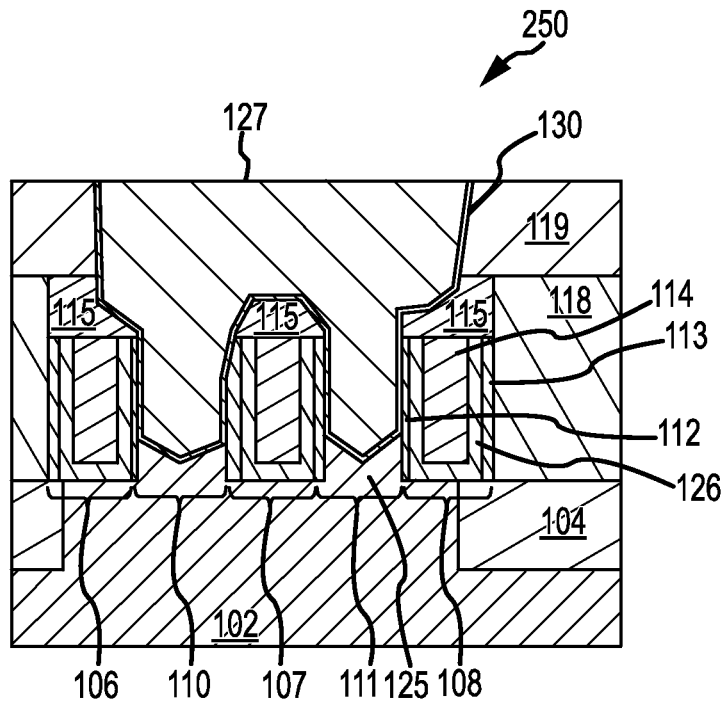
Figure 2D:
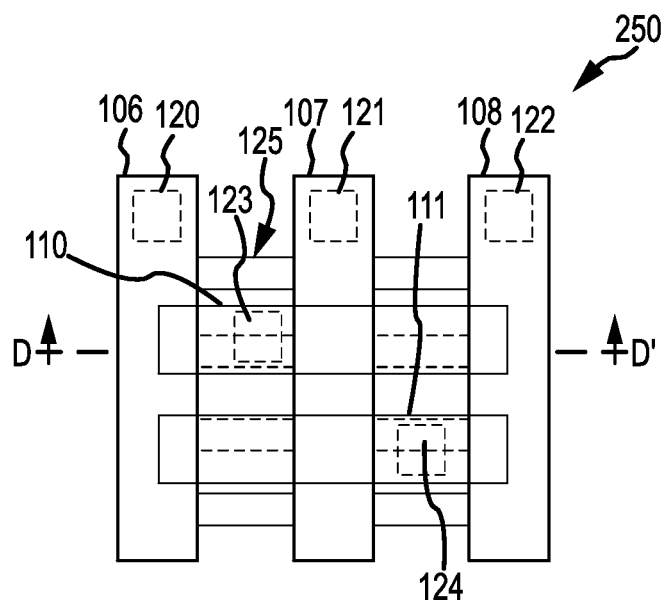

FIGS. 2A-2D illustrates examples of a capacitor structure in accordance with one or more implementations of the subject technology with FIG. 2A illustrating a cross-sectional view of a capacitor structure 200, FIG. 2B illustrating a top-view of the capacitor structure layout, FIG. 2C illustrating a cross-sectional view of a capacitor structure 250 with fin-shaped structures, FIG. 2D illustrating a top-view of the capacitor structure layout with the fin-shaped structures. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

Referring to FIG. 2A, the capacitor structure 200 includes a semiconductor substrate 102, an isolation region 104, gate terminal structures 106-108, and diffusion contact structures 110 and 111. Because the capacitor structure 200 is substantially similar to the capacitor structure 100 of FIG. 1A, only differences will be discussed with respect to FIG. 2A.

As shown in FIG. 2A, the diffusion contact structures 110, 111 are disposed on the top surface of the isolation layer 104 and across the gate terminal structures 106-108 (e.g., over and around a portion of the gate terminal structures 106-108). The diffusion contact structures 110 and 111 can be spaced apart in a direction perpendicular to the lateral axis (e.g., axis B-B') such that the diffusion contact structures 110 and 111 have an elongated shape that extends in a direction parallel to the lateral axis. The metal segment 127 of each of the diffusion contact structures 110 and 111 is dispensed into etched cavities between the gate terminal structures 106-108, and disposed adjacent to the top surface of the isolation region 104 and the first and second wall spacers of adjacent gate terminal structures. In this respect, the etch-stop structure 115 and first and second wall spacers 112, 113 of each of the gate terminal structures 106-108 are configured to electrically isolate the gate filler 114 from the metal segment 127. As such, capacitances can be formed between the gate filler 114 and the metal segment 127 acting as opposing metal plates.

In some aspects, the diffusion contact structures 110 and 111 are disposed adjacent to the etch-stop structure 115 of each of the gate terminal structures 106-108 and adjacent to the first and second wall spacers 112, 113 of at least one of the gate terminal structures (e.g., the gate terminal structure 107). Since the diffusion contact structures 110, 111 are arranged across the gate terminal structures 106-108, the diffusion contact structures 110, 111, which are laterally spaced apart in a direction perpendicular to the lateral axis, can be disposed over and adjacent to the etch-stop structure 115 of the gate terminal structure 107. In this respect, there may be no oxide layer such as third isolation layer 119 disposed between the etch-stop structure 115 of the gate terminal structure 107 and the adjacent diffusion contact structure. However, there may be an oxide layer such as the third isolation layer 119 disposed over and adjacent to the etch-stop structure 115 where one of the diffusion contact structures 110, 111 is not located (e.g., the space between the diffusion contact structures 110, 111).

Referring to FIG. 2B, the top-view of the layout of the capacitor structure 200 shows the gate terminal structures 106-108 laterally separated along the lateral axis (e.g., axis B-B') with the diffusion contact structures 110 and 111 laterally separated in a direction perpendicular to the lateral axis. The diffusion contact structures 110 and 111 are arranged across the gate terminal structures 106-108. In this respect, the length of the diffusion contact structures 110 and 111 may be greater than the length of the gate terminal structures 106-108. In some aspects, the length of the diffusion contact structures 110 and 111 is less than the length of the gate terminal structures 106-108.

The capacitor structure 200 includes first contacts 120-122 formed on opposite ends of the gate terminal structures 106-108 and second contacts 123 and 124 formed on the diffusion contact structures 110 and 111 with the first contacts of adjacent gate terminal structures being aligned with one another and the second contacts of adjacent diffusion contact structures being staggered of one another. In one or more implementations, the first contacts 120-122 are connected to the first contact node 128 and the second contacts 123 and 124 are connected to the second contact node 129 to complete the capacitor structure 100. The first contacts 120-122, being aligned with one another, can be connected to the first contact node 128 via a common metallization layer. On the other hand, the second contacts 123 and 124, being staggered of one another, can be connected to the second contact node 129 via respective metallization layers. In some aspects, the second contacts 123 and 124 are connected to a common metallization layer.

In certain aspects, the first contacts 120-122 are formed on centered locations of the gate terminal structures 106-108 and the second contacts 123 and 124 are formed on centered locations of the diffusion contact structures 110 and 111 with the first contacts of adjacent gate terminal structures being aligned with one another and the second contacts of adjacent diffusion contact structures being aligned with one another.

Referring to FIG. 2C, the capacitor structure 250 includes a semiconductor substrate 102, an isolation region 104, gate terminal structures 106-108, and diffusion contact structures 110 and 111. Because the capacitor structure 250 is substantially similar to the capacitor structure 150 of FIG. 1C, only differences will be discussed with respect to FIG. 2C.

The capacitor structure 250 includes fin-shaped structures 125 formed at a surface of the semiconductor substrate 102. The fin-shaped structures 125 may be spaced apart laterally in a direction perpendicular to the lateral axis (e.g., axis D-D') with the diffusion contact structures 110 and 111 disposed over and parallel to the fin-shaped structures 125.

Referring to FIG. 2D, the top-view of the layout of the capacitor structure 250 shows the gate terminal structures 106-108 laterally separated in a direction parallel to the lateral axis (e.g., axis D-D'). The diffusion contact structures 110 and 111 are laterally separated in a direction perpendicular to the lateral axis, and extend across the gate terminal structures 106-108 in a direction parallel to the lateral axis (e.g., axis D-D') while located between the opposite ends of the gate terminal structures 106-108. As shown in FIG. 2D, the fin-shaped structures 125 extend in a direction parallel to the diffusion contact structures 110 and 111.

The capacitor structure 250 includes first contacts 120-122 formed on opposite ends of the gate terminal structures 106-108 and second contacts 123 and 124 formed on the diffusion contact structures 110 and 111 with the first contacts of adjacent gate terminal structures being aligned with one another and the second contacts of adjacent diffusion contact structures being staggered of one another.

In one or more implementations, the first contacts 120-122 are connected to the first contact node 128 and the second contacts 123 and 124 are connected to the second contact node 129 to complete the capacitor structure 250. The first contacts 120-122, being aligned with one another, can be connected to the first contact node 128 via a common metallization layer. On the other hand, the second contacts 123 and 124, being staggered of one another, can be connected to the second contact node 129 via respective metallization layers. In some aspects, the second contacts 123 and 124 are connected to a common metallization layer.

Figure 3A:
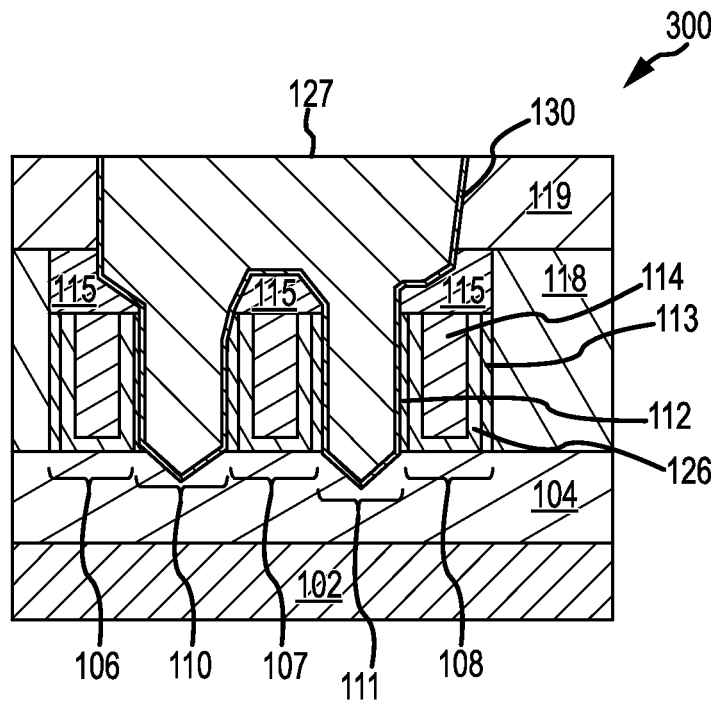
FIGS. 3A-3D illustrates examples of a capacitor structure in accordance with one or more implementations of the subject technology.
Figure 3B:
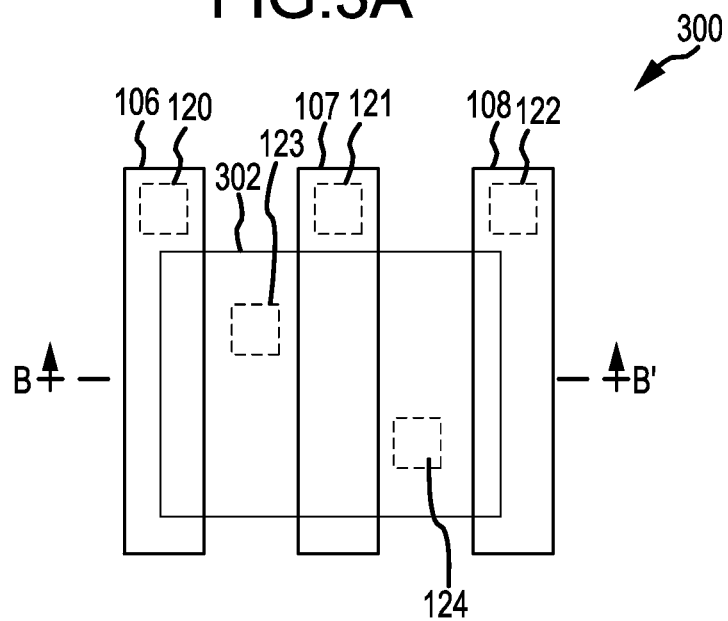
Figure 3C:
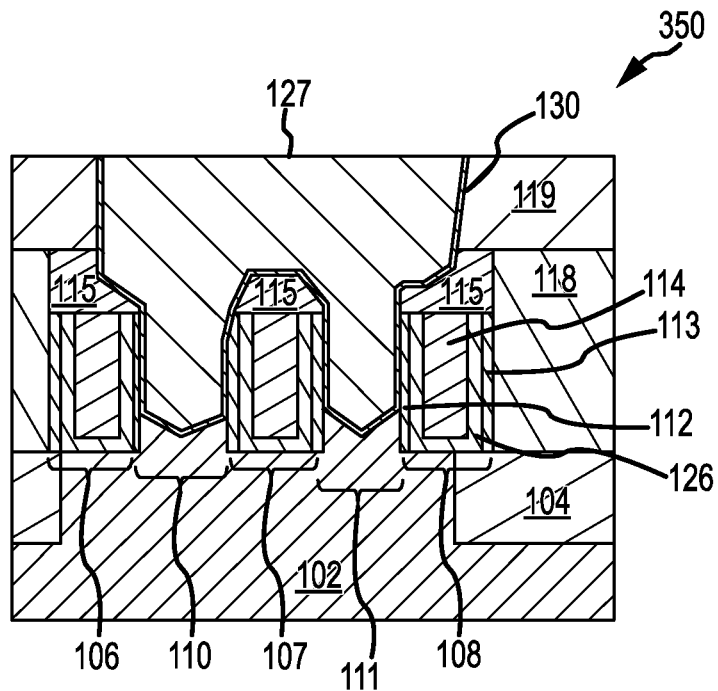
Figure 3D:
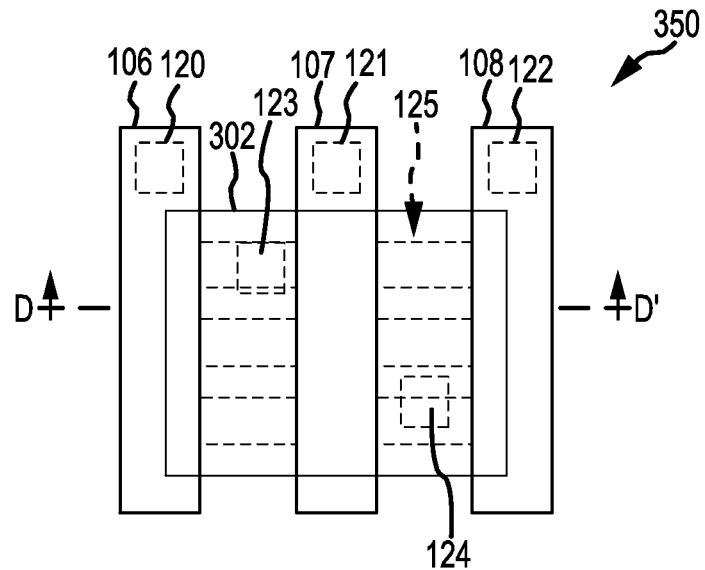

FIGS. 3A-3D illustrates examples of a capacitor structure in accordance with one or more implementations of the subject technology with FIG. 3A illustrating a cross-sectional view of a capacitor structure 300, FIG. 3B illustrating a top-view of the capacitor structure 300 layout, FIG. 3C illustrating a cross-sectional view of a capacitor structure 350 with fin-shaped structures, FIG. 3D illustrating a top-view of the capacitor structure 350 layout with the fin-shaped structures. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

Referring to FIG. 3A, the capacitor structure 300 includes a semiconductor substrate 102, an isolation region 104, gate terminal structures 106-108, and a diffusion contact structure 302. Because the capacitor structure 300 is substantially similar to the capacitor structure 200 of FIG. 2A, only differences will be discussed with respect to FIG. 3A.

As shown in FIG. 3A, the diffusion contact structure 302 is disposed above the semiconductor substrate 102 and across the gate terminal structures 106-108. The diffusion contact structure 302 can be a block of metal having a width that extends in a direction perpendicular to the lateral axis (e.g., axis B-B') and an elongated shape that extends parallel to the lateral axis.

The metal segment 127 of the diffusion contact structure 302 is dispensed into etched cavities between the gate terminal structures 106-108, and disposed adjacent to the top surface of the isolation region 104 and the first and second wall spacers of adjacent gate terminal structures. In this respect, the etch-stop structure 115 and first and second wall spacers 112, 113 of each of the gate terminal structures 106-108 are configured to electrically isolate the gate filler 114 from the metal segment 127. As such, capacitances can be formed between the gate filler 114 and the metal segment 127 acting as opposing metal plates.

In some aspects, the diffusion contact structure 302 is disposed adjacent to the etch-stop structure 115 of each of the gate terminal structures 106-108 and adjacent to the first and second wall spacers of at least one of the gate terminal structures (e.g., the gate terminal structure 107). Since the diffusion contact structure 302 is arranged across the gate terminal structures 106-108, the diffusion contact structure 302 can be disposed over and adjacent to the etch-stop structure 115 of the gate terminal structure 107. In this respect, there may be no oxide layer such as third isolation layer 119 disposed between the etch-stop structure 115 of the gate terminal structure 107 and the adjacent diffusion contact structure 302.

Referring to FIG. 3B, the top-view of the layout of the capacitor structure 300 shows the gate terminal structures 106-108 laterally separated along the lateral axis (e.g., axis B-B') with the diffusion contact structures 110 and 111 laterally separated in a direction perpendicular to the lateral axis. The diffusion contact structure 302 is arranged across the gate terminal structures 106-108 in a direction parallel to the lateral axis, and located between opposite ends of the gate terminal structures 106-108. In this respect, the width of the diffusion contact structure 302 is less than the length of the gate terminal structures 106-108.

The capacitor structure 300 includes first contacts 120-122 formed on the opposite ends of the gate terminal structures 106-108 and second contacts 123 and 124 formed on the diffusion contact structure 302 with the first contacts of adjacent gate terminal structures being aligned with one another and the second contacts 123, 124 being staggered of one another. In this respect, the second contacts 123 and 124 can be located on opposite corners of the diffusion contact structure 302.

In one or more implementations, the first contacts 120-122 are connected to the first contact node 128 and the second contacts 123 and 124 are connected to the second contact node 129 to complete the capacitor structure 300. In this respect, the first contacts 120-122 are connected to a common metallization layer, while the second contacts 123, 124 are connected to respective metallization layers.

In certain aspects, the first contacts 120-122 are formed on centered locations of the gate terminal structures 106-108 and the second contacts 123 and 124 are formed on centered locations of the diffusion contact structure 302 with the first contacts of adjacent gate terminal structures being aligned with one another and the second contacts 123, 124 being aligned with one another (e.g., aligned in a direction parallel to the lateral axis). In this respect, the first contacts 120-122 can be connected to the first contact node 128 via a first metallization layer, and the second contacts 123, 124 can be connected to the second contact node 129 via a second metallization layer.

Referring to FIG. 3C, the capacitor structure 350 includes a semiconductor substrate 102, an isolation region 104, gate terminal structures 106-108, and diffusion contact structures 110 and 111. Because the capacitor structure 350 is substantially similar to the capacitor structure 250 of FIG. 2C, only differences will be discussed with respect to FIG. 3C.

The capacitor structure 350 includes fin-shaped structures 125 formed at a surface of the semiconductor substrate 102. The fin-shaped structures 125 may be spaced apart laterally in a direction perpendicular to the lateral axis (e.g., axis D-D') with the diffusion contact structure 302 disposed over and extended in a direction parallel to the elongated shape of the fin-shaped structures 125.

Referring to FIG. 3D, the top-view of the layout of the capacitor structure 350 shows the diffusion contact structure 302 disposed across the gate terminal structures 106-108 in a direction parallel to the lateral axis (e.g., axis D-D'), and disposed across the fin-shaped structures 125 in a direction perpendicular to the lateral axis.

The capacitor structure 350 includes first contacts 120-122 formed on the opposite ends of the gate terminal structures 106-108 and second contacts 123 and 124 formed on the diffusion contact structure 302 with the first contacts of adjacent gate terminal structures being aligned with one another and the second contacts 123, 124 being staggered of one another. In this respect, the second contacts 123 and 124 can be located on opposite corners of the diffusion contact structure 302.

In one or more implementations, the first contacts 120-122 are connected to the first contact node 128 and the second contacts 123 and 124 are connected to the second contact node 129 to complete the capacitor structure 350. In this respect, the first contacts 120-122 are connected to a common metallization layer, while the second contacts 123, 124 are connected to respective metallization layers.

FIGS. 4A-4B illustrate top-view examples of a capacitor structure layout in accordance with one or more implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

Referring to FIG. 4A, the top-view of a capacitor structure layout 400 shows gate terminal structures 420, 421 laterally separated by diffusion contact structures 424, 425, and gate terminal structures 422, 423 laterally separated by diffusion contact structures 426, 427. The capacitor structure layout 400 includes the gate terminal structures 420, 421 aligned with one another, and the diffusion contact structures 424 and 425 aligned with one another and arranged between opposite ends of the gate terminal structures 420, 421. In this respect, the length of the diffusion contact structures 424, 425 can be less than a length of the gate terminal structures 420, 421.

The capacitor structure layout 400 includes first contacts 402-405 formed on opposite ends of the gate terminal structures 420, 421 and second contacts 410-413 formed on the diffusion contact structures 424, 425 with the first contacts of adjacent gate terminal structures (e.g., the gate terminal structures 420, 421) being aligned with one another and the second contacts of adjacent diffusion contact structures (e.g., the diffusion contact structures 424, 425) being staggered of one another. In addition, the capacitor structure layout 400 includes first contacts 406-409 formed on opposite ends of the gate terminal structures 422, 423 and second contacts 414-417 formed on the diffusion contact structures 426, 427 with the first contacts of adjacent gate terminal structures (e.g., the gate terminal structures 422, 423) being aligned with one another and the second contacts of adjacent diffusion contact structures (e.g., the diffusion contact structures 426, 427) being staggered of one another.

In one or more implementations, the first contacts 402-409 are connected to the first contact node 128 and the second contacts 410-417 are connected to the second contact node 129 to complete the capacitor structure. The first contacts 402-409 with pairs being aligned with one another, can have aligned pairs connected to the first contact node 128 via respective metallization layers. In some aspects, the aligned pairs of the first contacts 402-209 are connected to a common metallization layer. On the other hand, the second contacts 410-417, being staggered of one another, can be connected to the second contact node 129 via respective metallization layers. In some aspects, the second contacts 410-417 are connected to a common metallization layer.

In some aspects, the gate terminal structures 420, 421 and diffusion contact structures 424, 425 collectively represent a first capacitor structure, and the gate terminal structures 422, 423 and diffusion contact structures 426, 427 collectively represent a second capacitor structure. In this respect, the first and second capacitor structures can connect to the first and second contact nodes 128 and 129 to provide an increased capacitance density.

Referring to FIG. 4B, the top-view of a capacitor structure layout 450 shows the gate terminal structures 106-108 laterally separated by the diffusion contact structures 110 and 111 along the lateral axis (e.g., axis B-B'). The capacitor structure layout 400 includes the diffusion contact structures 424-427 staggered from the gate terminal structures 420-423. In some aspects, the length of the diffusion contact structures 424-427 is greater than the length of the gate terminal structures 420-423. The length of the diffusion contact structures 424-427 may be equivalent to the length of the gate terminal structures 420-423.

The capacitor structure layout 450 includes first contacts 452-455 formed on the gate terminal structures 420-423 and second contacts 456-459 formed on the diffusion contact structures 424-427. In certain aspects, the first contacts 452-455 are formed on centered locations of the gate terminal structures 420-423 and the second contacts 456-459 are formed on centered locations of the diffusion contact structures 424-427 with the first contacts of adjacent gate terminal structures being aligned with one another and the second contacts of adjacent diffusion contact structures being aligned with one another. In this respect, the first contacts 452-455 can be connected to the first contact node 128 via a first metallization layer, and the second contacts 456-459 can be connected to the second contact node 129 via a second metallization layer.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

Furthermore, it should be understood that spatial descriptions (e.g., "above", "below", "left," "right," "up", "down", "top", "bottom", etc.) used herein are for purposes of illustration only, and that practical implementations of the structures described herein can be spatially arranged in any orientation or manner.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A capacitor structure in a semiconductor device, the capacitor structure comprising:
   a semiconductor substrate;
   a first isolation layer disposed on a top surface of the semiconductor substrate;
   a first gate terminal structure disposed on a top surface of the first isolation layer;
   a first contact structure disposed over the first isolation layer and in contact with a sidewall of the first gate terminal structure;
   an etch-stop structure disposed on a top surface of the first gate terminal structure; and a second isolation layer disposed on a top surface of the etch-stop structure, the first contact structure extending through the second isolation layer and contacting the etch-stop structure, wherein the first gate terminal structure is connected to a first contact node and the first contact structure is connected to a second contact node, wherein the first and second contact nodes form opposing nodes of the capacitor structure.

2. The capacitor structure of claim 1, further comprising:
a second gate terminal structure disposed on the top surface of the first isolation layer; and
a second contact structure disposed on the top surface of the first isolation layer and arranged between the first and second gate terminal structures,
wherein the first and second gate terminal structures are laterally separated by the first and second contact structures along a lateral axis, wherein the first and second contact structures have an elongated shape that extends in a direction perpendicular to the lateral axis.

3. The capacitor structure of claim 2, wherein each of the first and second gate terminal structures comprises:
a first wall spacer;
a second wall spacer opposite of the first wall spacer; and
a gate filler disposed between the first and second wall spacers, wherein:
the etch-stop structure is disposed adjacent to the gate filler and the first and second wall spacers,
each of the first and second contact structures has a first sidewall surface and a second sidewall surface opposite of the first sidewall surface, and
the second sidewall surface of the first contact structure and the first sidewall surface of the second contact structure are disposed adjacent to the etch-stop structure and the first and second wall spacers of one of the first and second gate terminal structures.

4. The capacitor structure of claim 2, wherein the semiconductor substrate comprises a plurality of fin-shaped structures formed at the top surface of the semiconductor substrate, wherein the plurality of fin-shaped structures are spaced apart in the direction perpendicular to the lateral axis, and wherein the first and second contact structures are disposed over and across the plurality of fin-shaped structures.

5. The capacitor structure of claim 2, further comprising first contacts formed on opposite ends of the first and second gate terminal structures and second contacts formed on the first and second contact structures with the first contacts of adjacent gate terminal structures being aligned and the second contacts of adjacent contact structures being staggered of one another.

6. The capacitor structure of claim 5, Wherein the first and second contact structures are arranged between the opposite ends of the first and second gate terminal structures, and wherein a length of the first and second contact structures is less than a length of the first and second gate terminal structures.

7. The capacitor structure of claim 2, further comprising first contacts formed on centered locations of the first and second gate terminal structures and second contacts formed on centered locations of the first and second contact structures with the first contacts of adjacent gate terminal structures being aligned and the second contacts of adjacent contact structures being aligned.

8. The capacitor structure of claim 2, wherein the first and second contact structures are staggered from the first and second gate terminal structures.

9. The capacitor structure of claim 1, further comprising a third isolation layer disposed on the first isolation layer and in contact with the first contact structure, the second isolation layer contacting a top surface of the third isolation layer.

10. A capacitor structure in a semiconductor device, the capacitor structure comprising:
a semiconductor substrate;
a first isolation layer having a top surface and a bottom surface, the bottom surface of the first isolation layer disposed on a top surface of the semiconductor substrate;
a first gate terminal structure disposed on the top surface of the first isolation layer;
a second gate terminal structure disposed on the top surface of the first isolation layer; and
a first contact structure disposed over the top surface of the first isolation layer;
an etch-stop structure disposed on a top surface of the first and second gate terminal structures: and
a second isolation layer disposed on a top surface of the etch-stop structure, the first contact structure extending through the second isolation layer and contacting the etch-stop structure, wherein at least a portion of the first contact structure is disposed between the first gate terminal structure and the second gate terminal structure and in contact with sidewalls of the first and second gate terminal structures, wherein the first gate terminal structure and the second gate terminal structure are connected to respective first contact nodes and the first contact structure is connected to a second contact node, and wherein the respective first contact nodes and the second contact node form opposing nodes of the capacitor structure.

11. The capacitor structure of claim 10, wherein the first contact structure is arranged parallel to the first gate terminal structure and the second gate terminal structure.

12. The capacitor structure of claim 10, wherein the first contact structure is arranged across the first gate terminal structure and the second gate terminal structure.

13. The capacitor structure of claim 12, wherein the first contact structure has a length extending substantially from first ends of the first gate terminal structure and the second gate terminal structure to second ends of the first gate terminal structure and the second gate terminal structure.

14. The capacitor structure of claim 12, further comprising a second contact structure, wherein the second contact structure is arranged parallel to the first contact structure.

15. The capacitor structure of claim 14, wherein the first contact structure and the second contact structure are arranged between first ends of the first gate terminal structure and the second gate terminal structure and second ends of the first gate terminal structure and the second gate terminal structure.

16. The capacitor structure of claim 10, wherein at least one of the first gate terminal structure or the second gate terminal structure comprises:
a first wall spacer;
a second wall spacer opposite of the first wall spacer, and
a gate filler disposed between the first and second wall spacers,
wherein the etch-stop structure is disposed on and adjacent to the gate filler and the first and second wall spacers, and
wherein the first contact structure is disposed adjacent to the etch-stop structure and the first and second wall spacers.

17. The capacitor structure of claim 10, wherein the semiconductor substrate comprises a plurality of fin-shaped structures formed at the top surface of the semiconductor substrate.

18. The capacitor structure of claim 10, further comprising:
a second contact structure disposed on the top surface of the first isolation layer and arranged between the first and second gate terminal structures,
wherein the first and second gate terminal structures are laterally separated by the first and second contact structures along a lateral axis, wherein each of the first and second contact structures has an elongated shape that extends in a direction perpendicular to the lateral axis.

19. The capacitor structure of claim 18, further comprising first contacts formed on opposite ends of the first and second gate terminal structures and second contacts formed on the first and second contact structures with the first contacts of adjacent gate terminal structures being aligned and the second contacts of adjacent contact structures being staggered of one another.

20. The capacitor structure of claim 10, further comprising a third isolation layer disposed on the first isolation layer and in contact with the contact structure, the second isolation layer contacting a top surface of the third isolation layer.

21. A capacitor structure in a semiconductor device, the capacitor structure comprising:
a semiconductor substrate;
a first isolation layer disposed on the semiconductor substrate;
a gate terminal structure disposed on the first isolation layer; and
a contact structure disposed on the first isolation layer;
an etch-stop structure disposed on a top surface of the gate terminal structure; and
a second isolation layer disposed on a top surface of the etch-stop structure, the contact structure extending through the second isolation layer and contacting the etch-stop structure, wherein at least a portion of the contact structure is in contact with a sidewall of the gate terminal structure, wherein the gate terminal structure is connected to a first contact node and the contact structure is connected to a second contact node, and wherein the first contact node and the second contact node form opposing nodes of the capacitor structure.

* * * * *